(12) United States Patent
Lebrun

(10) Patent No.: US 7,199,396 B2
(45) Date of Patent: Apr. 3, 2007

(54) ACTIVE MATRIX OF THIN-FILM TRANSISTORS (TFT) FOR AN OPTICAL SENSORS OR DISPLAY SCREEN

(75) Inventor: Hugues Lebrun, Coublevie (FR)

(73) Assignee: Thales Avionics LCD S.A., Neuilly-sur-seine (FR)

( * ) Notice: Subject to any disclaimer, the term of this patent is extended or adjusted under 35 U.S.C. 154(b) by 26 days.

(21) Appl. No.: 10/480,151

(22) PCT Filed: Jun. 28, 2002

(86) PCT No.: PCT/FR02/02258

§ 371 (c)(1),
(2), (4) Date: Dec. 10, 2003

(87) PCT Pub. No.: WO03/003463

PCT Pub. Date: Jan. 9, 2003

(65) Prior Publication Data

US 2005/0173703 A1 Aug. 11, 2005

(30) Foreign Application Priority Data

Jun. 29, 2001 (FR) .................................. 01 08625

(51) Int. Cl.
*G02F 1/1343* (2006.01)
(52) U.S. Cl. ............................. 257/59; 349/38; 349/39
(58) Field of Classification Search .................. 349/38, 349/39
See application file for complete search history.

(56) References Cited

U.S. PATENT DOCUMENTS

| | | | |
|---|---|---|---|
| 5,576,858 A * | 11/1996 | Ukai et al. ..................... 349/42 |
| 5,745,195 A * | 4/1998 | Zhang ........................... 349/39 |
| 5,946,065 A * | 8/1999 | Tagusa et al. .............. 349/138 |
| 6,078,367 A * | 6/2000 | Satou ........................... 349/46 |
| 6,191,830 B1 | 2/2001 | Gogna et al. |
| 6,327,006 B1 * | 12/2001 | Sato et al. ..................... 349/44 |
| 6,411,346 B1 * | 6/2002 | Numano et al. .............. 349/39 |
| 6,784,949 B1 * | 8/2004 | Nagata et al. ................. 349/39 |
| 6,815,716 B2 | 11/2004 | Sanson et al. |

FOREIGN PATENT DOCUMENTS

| | | |
|---|---|---|
| FR | 2 737 314 | 1/1997 |
| FR | 2 772 499 | 6/1999 |

OTHER PUBLICATIONS

W. Den Boer, et al. "Similarities between TFT arrays for direct-conversion X-ray sensors and high-aperture AMLCDs", 1998 SID International Symposium Digest of Technical Papers, vol. 29, pp. 371-374, May 17-22, 1998.

* cited by examiner

*Primary Examiner*—David Nelms
*Assistant Examiner*—Thanh-Nhan P. Nguyen
(74) *Attorney, Agent, or Firm*—Oblon, Spivak, McClelland, Maier & Neustadt, P.C.

(57) ABSTRACT

The invention relates to an active matrix of thin-film transistors or TFTs for an optical sensor, comprising a matrix of transistors formed on a substrate comprising a gate, a drain and a source, a set of rows and a set of columns that are connected to the gates and to an electrode of the transistor, respectively, pixel electrodes and, according to the invention, a set of capacitive electrodes lying at the same level as the electrodes of the transistors so as to form, with the pixel electrodes, storage capacitors.

14 Claims, 3 Drawing Sheets

US 7,199,396 B2

ACTIVE MATRIX OF THIN-FILM TRANSISTORS (TFT) FOR AN OPTICAL SENSORS OR DISPLAY SCREEN

FIELD OF THE INVENTION

The present invention relates to an active matrix of thin-film transistors or TFTs for optical sensors or display screens.

The use of an active matrix of thin-film transistors is well known in the field of liquid-crystal display screens or optical sensors for X-rays. Typically, such a matrix comprises a substrate, matrix of TFT transistors formed on this substrate, each transistor comprising a gate, a first electrode or drain and a second electrode or source, a set of rows for controlling the TFT transistors via the gate, this set of rows being placed on the substrate, a conducting level in a defined pattern forming a matrix of pixel electrodes, the pixel electrodes being connected to one of the electrodes of the transistors, a set of columns for transferring charges through the transistors between the pixel electrodes and drive electronics, the columns being connected to the other electrode of the transistors, and an insulating layer between the pixel electrodes and the columns, this insulating layer being open locally to each pixel in order to bring the pixel electrodes into contact with the other electrode of the transistor.

When an active matrix of this type has to be used in an optical sensor, it includes a photosensitive semiconductor layer in contact with the pixel electrodes in order to convert the electromagnetic radiation into charges picked up by the electrodes. In this case, the electromagnetic radiation that strikes the photosensitive semiconductor layer is converted into electrical charges which are picked up by the pixel electrodes. These electrical charges are analysed in an electronic circuit in order to display a point-by-point image, for example using liquid-crystal displays. More particular use of a matrix of TFTs of the type above relates to the production of images from X-rays when the semiconductor layer is advantageously formed from selenium.

According to another application, an active matrix of thin-film transistors of the type described above can be used in a display screen of the reflective or transflective type. In this case, the pixel electrodes are made of a reflecting material, such as aluminum, and a liquid-crystal layer covers the pixel electrodes, being associated with a transparent substrate.

BACKGROUND OF THE INVENTION

Referring more particularly to the case of an optical sensor, used in X-ray imaging, in order to improve the contrast of the images obtained, it is useful to have a large capacitor on the pixel electrodes in order to store a large amount of charge since, the higher the charge stored, the better the image contrast. Currently, and as shown in FIG. 1, a large storage capacitor is obtained by producing a buried ground plane and a capacitive electrode on the gate's level. More precisely, a layer of a metal such as titanium is deposited on a substrate 1 for the purpose of forming a ground plane 2. This titanium layer is etched so as to obtain the capacitive electrode 2. Next, an insulation layer 3, made of a material such as silicon oxide $SiO_2$, with a thickness of 2000 Å for example, is deposited in a known manner on this capacitive electrode 2. A titanium/molybdenum metal bilayer is then deposited on the insulating layer, which bilayer is then etched so as to produce the gate 4 of the thin-film transistor as well as a second electrode 5 which forms a storage capacitor with the electrode 2. Next, an insulating layer 6 made of silicon nitride SiN, having for example a thickness of 3000 Å, is deposited in a known manner, followed by a layer 7 of semiconductor material such as, for example, amorphous silicon. This layer 7 is etched in a known manner. Next, a metal layer, for example made of molybdenum, is deposited and etched so as to produce the first electrode 8 or drain and the second electrode 9 or source of the thin-film transistors. The source electrode 9 is connected in a known manner at 10 to the capacitive electrode 5. Once the source and drain 8, 9 have been produced, a layer 11 of an insulating material such as silicon nitride SiN is deposited with a larger thickness, for example about 5000 Å. A connection hole 13 is then produced down to the source 9, the role of which will be explained later. Next, a transparent metal layer, such as a layer of ITO (indium titanium oxide), is deposited in a known manner on the SiN insulating layer so as to produce the pixel electrode 12. This pixel electrode is connected via the hole 13 to the source 9 in order to operate in a known manner. In this case, the storage capacitor is obtained between the electrode 5 and the electrode 2 forming the ground plane. However, to produce this storage capacitor, it is necessary to have two additional masking levels paired with a standard active matrix production process. In addition, the insulator of the capacitor, namely the insulating layer 3, must be thin so as to guarantee the highest possible storage capacitance.

SUMMARY OF THE INVENTION

The object of the present invention is to propose a novel active matrix structure of thin-film transistors or TFTs for an optical sensor or a display screen, which does not require the two masking levels described above.

Consequently, the subject of the present invention is an active matrix of thin-film transistors or TFTs for an optical sensor or display screen, of the type comprising:

a substrate;

a matrix of TFT transistors formed on this substrate, each transistor comprising a gate, a first electrode or drain and a second electrode or source;

a set of row electrodes for controlling the TFT transistors via their gates, this set of rows being placed on the substrate;

a conducting level in a defined pattern forming a matrix of pixel electrodes, the pixel electrodes being connected to one of the electrodes of the transistors;

a set of columns for transferring charges through the transistors between the pixel electrodes and drive electronics, the columns being connected to the other electrode of the transistors; and an insulating layer between the pixel electrodes and the columns, this insulating layer being open locally to each pixel in order to bring the pixel electrode into contact with the other electrode of the transistor;

characterized in that it includes a set of capacitive electrodes lying at the same level as the electrodes of the transistors so as to form, with the pixel electrodes, storage capacitors.

Thus, according to the invention, the same material as that used to produce the first electrode or drain and the second electrode or source of the TFT transistors is used to produce the storage capacitor, the capacitive electrode being produced at the same level as these two electrodes. Consequently, the storage capacitor is formed between the metallic material of the pixel electrode and a ground plane produced in the same metal as the two, drain and source, electrodes of the transistors.

According to another feature of the present invention, the capacitive electrodes are connected so as to form storage lines parallel to the columns, the set of storage lines being connected to the same potential.

According to another feature of the present invention, the active matrix includes connections forming a bridge for connecting the storage lines so as to produce a ground plane.

According to yet another feature of the present invention, it also comprises additional storage lines lying at the same level as the gates of the transistors and parallel to the columns, these additional storage lines forming, with the capacitive electrodes, storage capacitors.

According to a preferred embodiment, the additional storage lines are produced in the same material as the gates of the transistors. Moreover, depending on the use of the active matrix of thin-film transistors or TFTs, the active matrix will be covered with a photosensitive semiconductor layer in contact with the pixel electrodes in order to convert the electromagnetic radiation into electrical charges picked up by the electrodes in the case of optical sensors, or the active matrix will be covered with a liquid-crystal layer and then by a transparent glass substrate, in the case of a reflective display screen.

BRIEF DESCRIPTION OF THE FIGURES

Other features and advantages of the present invention will become apparent on reading the description of a preferred embodiment, given with reference to the drawings appended hereto, in which.

DETAILED DESCRIPTION OF A PREFERRED AND ALTERNATE EMBODIMENTS

To simplify the description, the same elements in the figures bear the same reference numbers.

Figure 1:
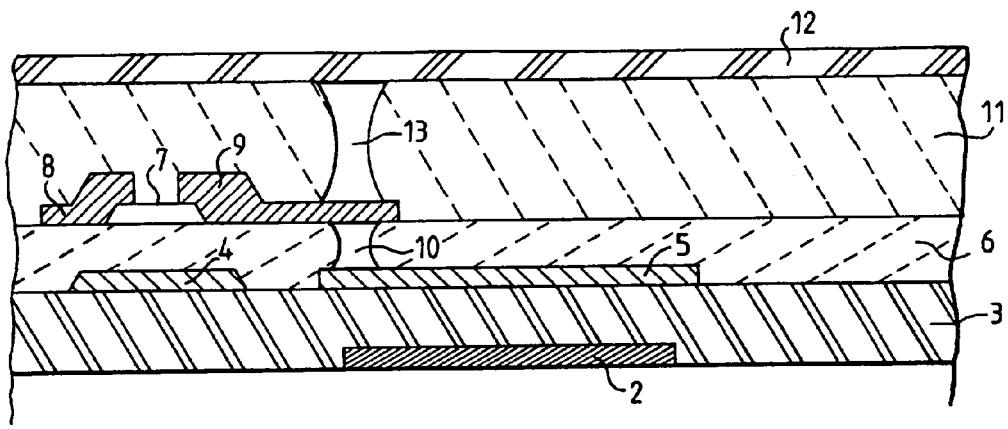
FIG. 1, already described, is a schematic vertical sectional view of a pixel associated with a TFT transistor in an active matrix according to the prior art.

An exemplary embodiment of a thin-film transistor active matrix according to the present invention will now be described with reference to FIGS. 2 to 4. To simplify the description, in this embodiment the elements identical to those of FIG. 1 are given the same reference numbers, especially as regards the transistor and the pixel electrode. Moreover, FIG. 2 corresponds to a cross section on A—A in FIG. 3.

Figure 2:
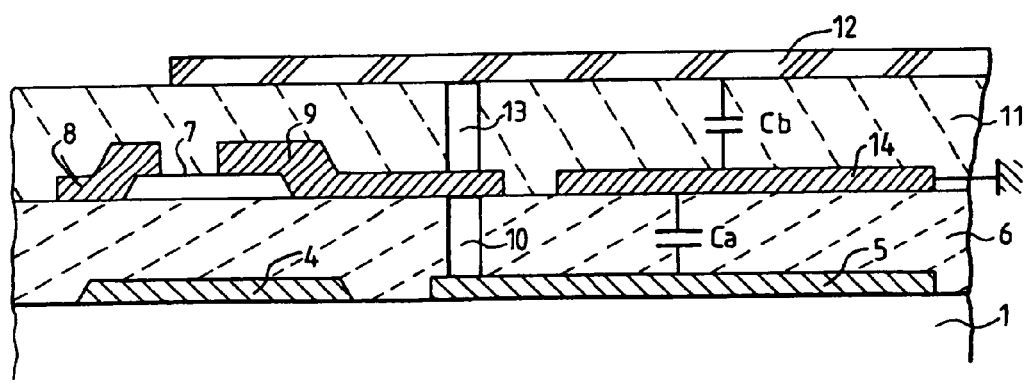
FIG. 2 is a schematic vertical sectional view of a pixel associated with a TFT transistor according to one embodiment of the present invention.

As shown in FIG. 2, a metal layer, for example a titanium-molybdenum bilayer, has been deposited on a substrate 1, which layer has been etched to produce the electrode 4 of the thin-film transistors and a capacitive electrode 5 whose role will be explained below. An insulating layer 6 of relatively small thickness, for example 3000 Å, has been deposited on this metal layer. This insulating layer is, in the embodiment shown, a layer of silicon nitride SiN. Connection holes 10 have been produced in a known manner above the capacitive electrodes 5. The role of these connection holes will be explained later. Next, to produce the thin-film transistors, a conducting layer, for example made of amorphous silicon, is deposited on the insulating layer 6 of SiN in order to produce the thin-film transistors. This conducting layer is etched in a known manner in order to produce the conducting layer 7 of the thin-film transistors. Next, a metal layer, for example a molybdenum layer, is deposited and etched so as to form a first electrode or drain 8 and a second electrode or source 9 for the thin-film transistors above the layer 7. According to the present invention, and as shown more precisely in FIGS. 3 and 4, the molybdenum metal layer is also etched so as to produce capacitive electrodes 14.

Figure 3:
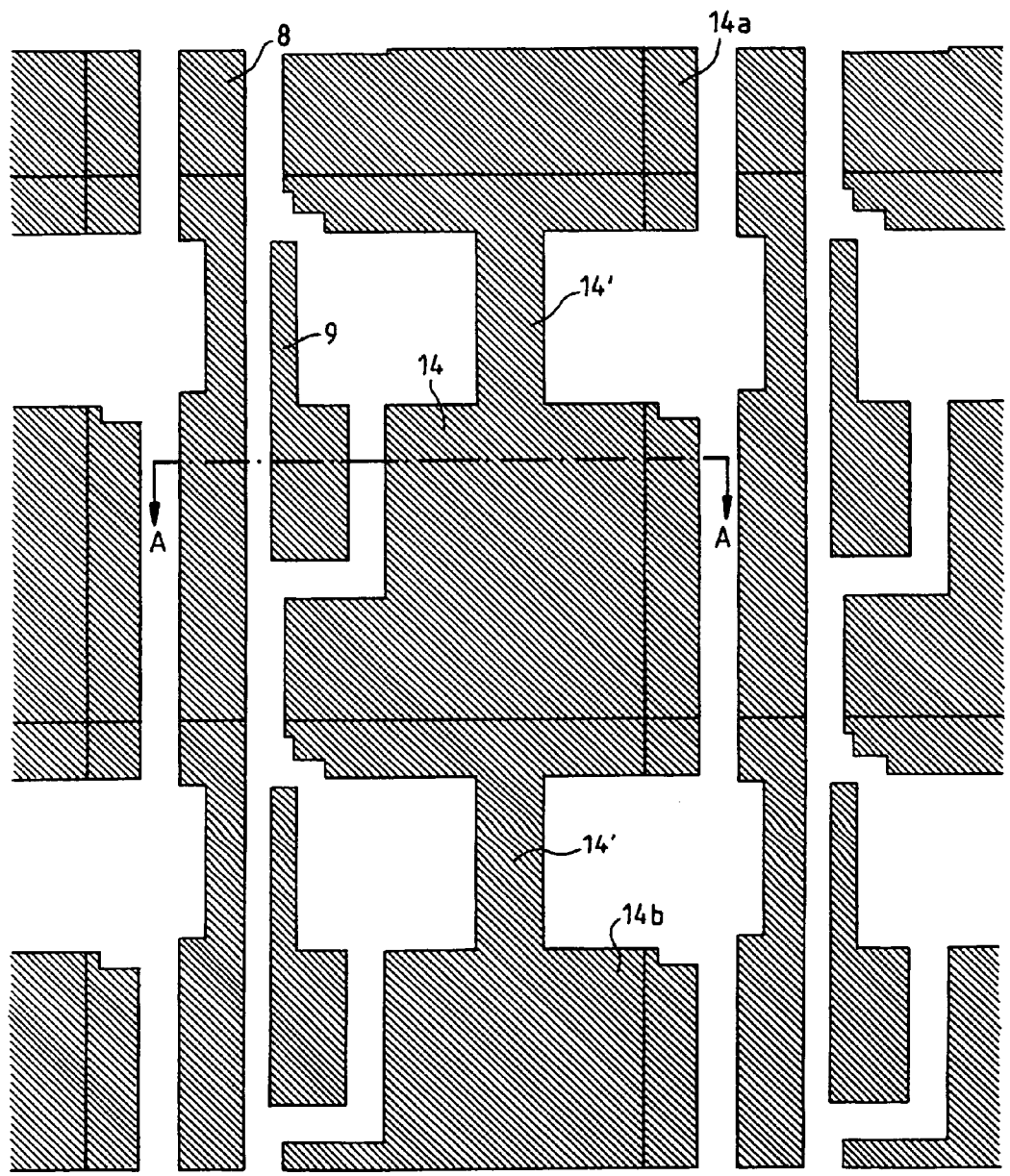
FIG. 3 is a schematic plan view of the metal level of the first electrode or drain and second electrode or source of the TFT transistor associated with capacitive electrodes according to the present invention.

As shown in FIG. 3, these capacitive electrodes 14, the role of which will be explained below, are connected to one another by conducting strips 14' of molybdenum so as to form columns of capacitive electrodes such as 14a, 14b. Next, a layer 11 of an insulating material, which may have for example a thickness of 5000 Å, is deposited in a known manner. This layer of insulating material is produced, for example, from silicon nitride or SiN. Connection holes 13 are produced in this insulating layer 11 in a known manner down to the electrode 9 or source. A layer of a conducting material, which may be either a transparent conducting material such as ITO (indium tin oxide) or SnO (tin oxide) or a reflective material such as aluminum, is deposited on the insulating layer. This metal layer 12 is etched so as to produce the pixel electrodes. Next, it is possible to deposit a transparent semiconductor layer, such as a selenium layer in order to capture X-rays, or a liquid-crystal layer, in order to produce a display screen, depending on the use to which the active matrix will be put.

Figure 4:
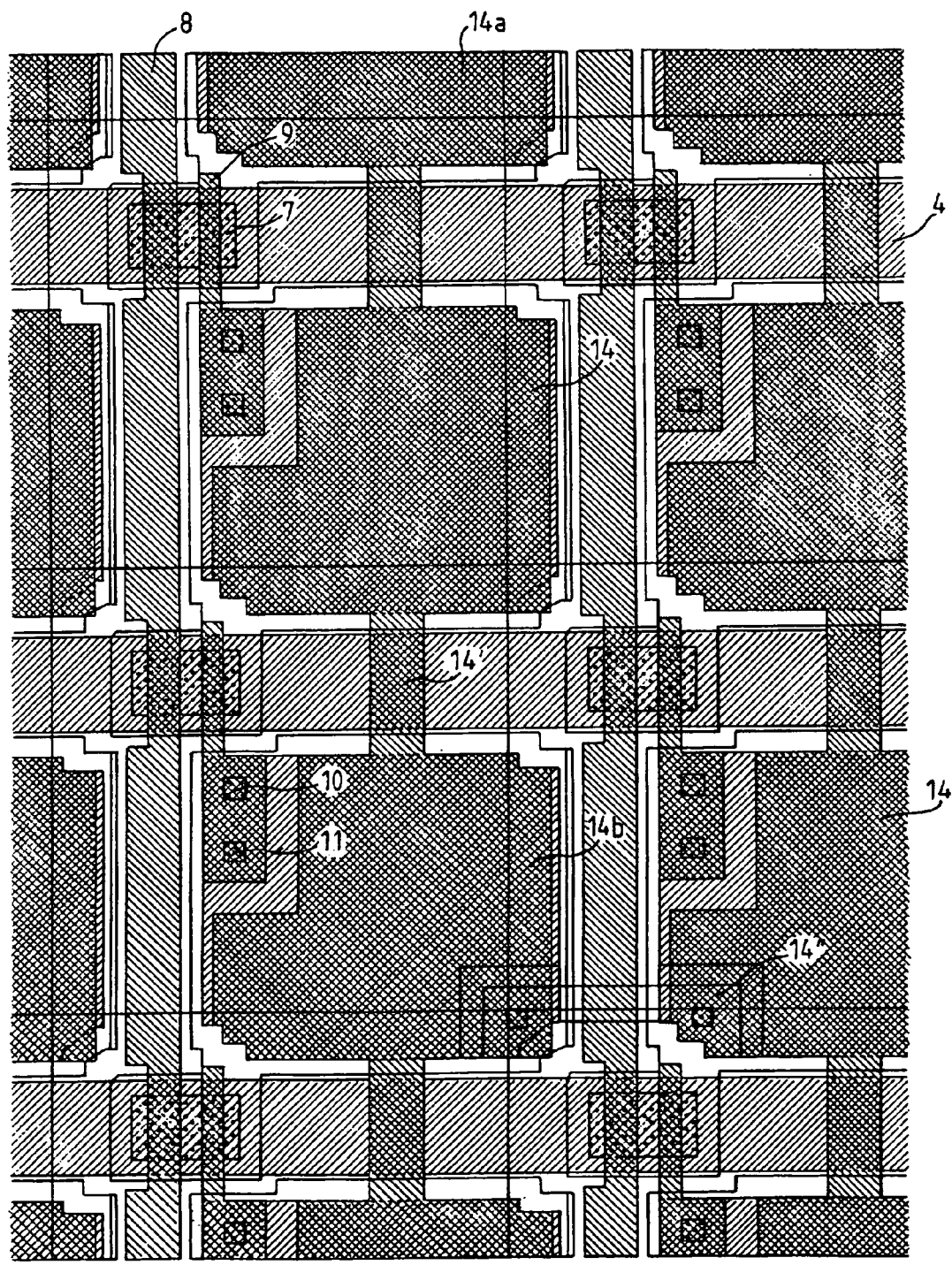
FIG. 4 is a schematic plan view of a TFT transistor active matrix according to the present invention, used in an optical sensor.

According to an alternative embodiment as shown in FIG. 4, the columns of capacitive electrodes 14a, 14, 14b may be connected to one another via a bridge 14" made of a conducting material such as molybdenum, passing above the electrode or drain forming the column 8. Thus, the set of capacitive electrodes is connected to the same potential and forms a buried earth plane which helps the charges to flow away. According to the present invention, it is possible to use a single bridge between two columns of capacitive electrodes, as shown in FIG. 4, or several bridges, especially one bridge per capacitive electrode or one bridge every N capacitive electrodes.

By comparing the process for producing a thin-film transistor active matrix according to the prior art, as shown in FIG. 1, with that for producing an active matrix according to the present invention, as shown in FIG. 2, it will be appreciated that the fact of producing the capacitive electrodes at the same level as the first and second electrodes, or source and drain, of the transistors makes it possible to eliminate two photolithography steps. Moreover, the pixel electrodes 12 and the capacitive electrodes 5 lying at the same level as the gates are at the same potential, since they are connected to the source electrode 9 via the connections 13 and 10, as shown in FIG. 2. Consequently, two capacitors Ca and Cb in parallel are obtained, and this results in a large storage capacitor allowing better image contrast to be achieved.

It is obvious to those skilled in the art that the embodiment given above has been described by way of example and that, in particular, the materials and thicknesses used may be modified in a known manner without departing from the scope of the present invention.

The invention claimed is:

1. An active matrix of thin-film transistors (TFTs) for an optical sensor or display screen, comprising:
   a substrate;
   a matrix of TFT transistors formed on the substrate, each TFT comprising a gate, a first electrode or drain and a second electrode or source;
   a set of row electrodes placed on the substrate for controlling the TFTs via the gates;
   a conducting level in a defined pattern forming a matrix of pixel electrodes being connected to one of the electrodes of the TFTs;
   a set of columns configured to transfer charges through the TFTs between the pixel electrodes and drive electronics, the columns being connected to the other electrode of the TFTs; and
   an insulating layer between the pixel electrodes and the columns, the insulating layer being open locally to each pixel in order to bring the pixel electrode into contact with the other electrode of the TFT;
   a set of capacitive electrodes lying at the same level as the electrodes of the TFTs so as to form, with the pixel electrodes, storage capacitors, additional storage lines lying at the same level as the gates of the TFTs and parallel to the columns, the additional storage lines forming, with the capacitive electrodes, storage capacitors.

2. The matrix as claimed in claim 1, wherein the capacitive electrodes are produced in a same material as the source and drain electrodes of the TFTs.

3. The matrix as claimed in claim 1, wherein the capacitive electrodes are connected so as to form storage lines parallel to the columns.

4. The matrix as claimed in claim 3, wherein the set of storage lines is connected to a same potential.

5. The matrix as claimed in claim 3, including connections forming a bridge for connecting the storage lines so as to produce a ground plane.

6. The matrix as claimed in claim 1, wherein the additional storage lines are produced in a same material as the gates of the TFTs.

7. The matrix as claimed in claim 1, including a photosensitive semiconductor layer in contact with the pixel electrodes configured to convert the electromagnetic radiation into electrical charges picked up by the electrodes.

8. An optical sensor, in particular for X-rays, comprising an active matrix as claimed in claim 7.

9. An optical sensor, in particular for X-rays, comprising an active matrix as claimed in claim 1.

10. The matrix as claimed in claim 1, comprising a layer of liquid crystal, with a back electrode and with a transparent substrate.

11. A display screen of the reflective or transflective type, comprising an active matrix as claimed in claim 1.

12. The active matrix according to claim 1, wherein the pixel electrodes are connected to the one of the electrodes of the TFTs by a connection formed in the insulating layer between the pixel electrodes and the one of the electrodes of the TFTs.

13. The active matrix according to claim 1, wherein the only layer between the pixel electrodes and the capacitive electrodes is the insulating layer.

14. The active matrix according to claim 1, wherein the planar elements are connected to each other via bridges, the bridges passing over or under the first electrode or drain.

* * * * *